United States Patent
Liu et al.

(10) Patent No.: US 11,139,341 B2
(45) Date of Patent: Oct. 5, 2021

(54) PROTECTION OF MRAM FROM EXTERNAL MAGNETIC FIELD USING MAGNETIC-FIELD-SHIELDING STRUCTURE

(71) Applicant: Taiwan Semiconductor Manufacturing Co., Ltd., Hsin-Chu (TW)

(72) Inventors: Kuo-An Liu, Hsinchu (TW); Chung-Cheng Wu, Ju-Bei (TW); Harry-Hak-Lay Chuang, Zhubei (TW); Gwan-Sin Chang, Hsinchu (TW); Tien-Wei Chiang, Taipei (TW); Zhiqiang Wu, Chubei (TW); Chia-Hsiang Chen, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 83 days.

(21) Appl. No.: 16/379,901

(22) Filed: Apr. 10, 2019

(65) Prior Publication Data

US 2019/0386061 A1    Dec. 19, 2019

Related U.S. Application Data

(60) Provisional application No. 62/686,239, filed on Jun. 18, 2018.

(51) Int. Cl.
*H01L 27/22* (2006.01)
*H01L 43/08* (2006.01)
(Continued)

(52) U.S. Cl.
CPC ............ *H01L 27/228* (2013.01); *H01L 43/02* (2013.01); *H01L 43/08* (2013.01); *G11C 11/1695* (2013.01)

(58) Field of Classification Search
CPC ....... H01L 27/228; H01L 43/02; H01L 43/08; H01L 2224/48247; H01L 224/4826; G11C 11/1695
(Continued)

(56) References Cited

U.S. PATENT DOCUMENTS

| 5,989,406 A | 11/1999 | Beetz, Jr. et al. |
| 7,336,556 B2 | 2/2008 | Okayama et al. |

(Continued)

FOREIGN PATENT DOCUMENTS

| CN | 104853576 A | 8/2015 |
| CN | 108074825 A | 5/2018 |

(Continued)

OTHER PUBLICATIONS

Non-Final Office Action dated Oct. 28, 2020 in connection with U.S. Appl. No. 16/381,410.

(Continued)

*Primary Examiner* — Thinh T Nguyen
(74) *Attorney, Agent, or Firm* — Eschweiler & Potashnik, LLC

(57) ABSTRACT

In some embodiments, the present application provides a memory device. The memory device includes a chip that includes a magnetic random access memory (MRAM) cell. A magnetic-field-shielding structure comprised of conductive or magnetic material at least partially surrounds the chip. The magnetic-field-shielding structure comprises a sidewall region that laterally surrounds the chip, an upper region extending upward from the sidewall region, and a lower region extending downward from the sidewall region. At least one of the upper region and/or lower region terminate at an opening over the chip.

20 Claims, 9 Drawing Sheets

(51) Int. Cl.
*H01L 43/02* (2006.01)
*G11C 11/16* (2006.01)

(58) Field of Classification Search
USPC .......................... 257/422, 629; 438/958, 48
See application file for complete search history.

(56) References Cited

U.S. PATENT DOCUMENTS

| | | |
|---|---|---|
| 7,598,596 B2 | 10/2009 | Molla et al. |
| 9,048,413 B2 | 6/2015 | Zeng |
| 10,588,250 B2 | 3/2020 | Woo et al. |
| 2004/0058138 A1 | 3/2004 | Inazawa et al. |
| 2005/0089708 A1 | 4/2005 | Maruko et al. |
| 2005/0226030 A1 | 10/2005 | Kato |
| 2005/0230788 A1 | 10/2005 | Kato |
| 2006/0180880 A1 | 8/2006 | Wang |
| 2006/0289970 A1 | 12/2006 | Gogl et al. |
| 2007/0103967 A1 | 5/2007 | Boeve |
| 2008/0122047 A1 | 5/2008 | Honer |
| 2009/0122597 A1 | 5/2009 | Sugibayashi |
| 2010/0072566 A1 | 3/2010 | Kang et al. |
| 2010/0164077 A1 | 7/2010 | Bando |
| 2010/0270660 A1 | 10/2010 | Masuda |
| 2011/0304015 A1 | 12/2011 | Kim |
| 2012/0051122 A1 | 3/2012 | Tsuji et al. |
| 2014/0015116 A1 | 1/2014 | Fu et al. |
| 2014/0042568 A1 | 2/2014 | Yamakawa |
| 2015/0084141 A1 | 3/2015 | Fujimori |
| 2016/0093795 A1 | 3/2016 | Arai |
| 2016/0172580 A1* | 6/2016 | Matsubara et al. ..... H01L 43/02 257/422 |
| 2016/0322562 A1 | 11/2016 | Jang et al. |
| 2016/0381843 A1 | 12/2016 | Ozaki |
| 2017/0025361 A1 | 1/2017 | Lee et al. |
| 2017/0047507 A1 | 2/2017 | Seo et al. |
| 2017/0077390 A1 | 3/2017 | Otsuka |

FOREIGN PATENT DOCUMENTS

| | | |
|---|---|---|
| JP | H0529197 A | 2/1993 |
| JP | 2003309196 A | 10/2003 |
| JP | 2016129206 A | 7/2016 |

OTHER PUBLICATIONS

Komitsky et al. "Die Attach in Lead Frame Packages: Step 4." SolidState Technology. The date of publication is unknown. Retrieved online on Aug. 14, 2018 from https://electroiq.com/2004/04/die-attach-in-lead-frame-packages-step-4/.

U.S. Appl. No. 16/381,410, filed Apr. 11, 2019.

Unknown Author. "SemiConductor—What is SemiConductor?" Computer Notes, published on Apr. 3, 2013.

Notice of Allowance dated Apr. 5, 2021 in connection with U.S. Appl. No. 16/381,410.

* cited by examiner

PROTECTION OF MRAM FROM EXTERNAL MAGNETIC FIELD USING MAGNETIC-FIELD-SHIELDING STRUCTURE

REFERENCE TO RELATED APPLICATION

This application claims priority to U.S. Provisional Application No. 62/686,239, filed on Jun. 18, 2018, the contents of which are hereby incorporated by reference in their entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or magnetic RAM (MRAM), and thus are promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
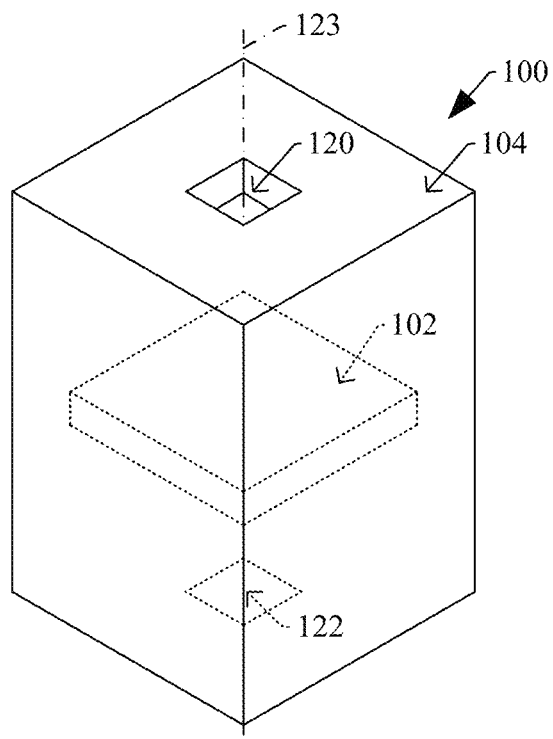
FIG. 1A illustrates a perspective view of a memory device that makes use of a magnetic-field-shielding structure in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. For MTJs with positive tunnelling magnetoresistance (TMR), if the magnetization directions of the reference layer and free layer are in a parallel orientation, it is more likely that electrons will tunnel through the tunnel barrier layer, such that the MTJ is in a low-resistance state. Conversely, if the magnetization directions of the reference layer and free layer are in an anti-parallel orientation, it is less likely that electrons will tunnel through the tunnel barrier layer, such that the MTJ is in a high-resistance state. Consequently, the MTJ can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). It is noted that MTJs can also have a negative TMR, e.g., lower resistance for anti-parallel orientation and higher resistance for parallel orientation.

Because of their binary nature, MTJs are used in memory cells to store digital data, with the low resistance state $R_P$ corresponding to a first data state (e.g., logical "0"), and the high-resistance state $R_{AP}$ corresponding to a second data state (e.g., logical "1"). Thus, some chips include one or more arrays of MRAM cells where each MRAM cell makes use of an MTJ to store a data state. However, when such a chip comes under the presence of an external magnetic field, the external magnetic field can undesirably "flip" the data states stored in the MRAM cells, leading to data retention problems. To mitigate the adverse effects of external magnetic fields, the present disclosure contemplates at least partially surrounding an MRAM chip with a magnetic-field-shielding structure. The magnetic-field-shielding structure at least partially surrounds the chip and defines a magnetically-shielded zone surrounding the chip. The magnetically-shielded zone, which lies within the magnetic-field-shielding structure, has a first magnetic field magnitude that is less than a second magnetic field magnitude immediately outside of an outermost surface of the magnetic-field-shielding structure. Thus, the magnetic-field-shielding structure reduces the magnetic field experienced by the chip, thereby helping to improve data retention within the MRAM cells of the chip.

Figure 1B:
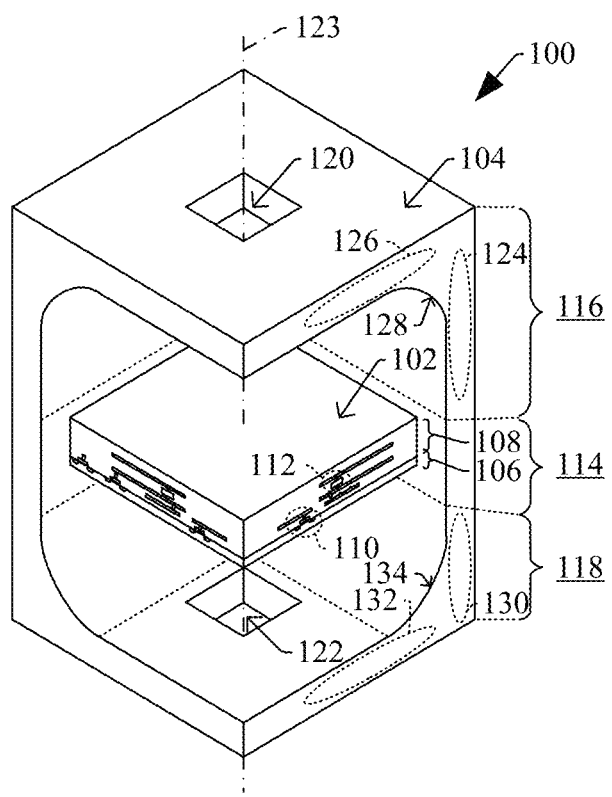
FIG. 1B illustrates a perspective view of the memory device of FIG. 1A with the front portions removed to more clearly depict inner portions of the memory device.

FIG. 1A illustrates a perspective view of a memory device 100 in accordance with some embodiments, and FIG. 1B illustrates a perspective view of the memory device 100 of FIG. 1A with the front portions removed to more clearly depict inner portions of the memory device. As shown in FIGS. 1A-1B, the memory device 100 includes a chip 102 and a magnetic-field-shielding structure 104. An innermost surface of the magnetic-field-shielding structure 104 at least partially surrounds the chip 102 and establishes a magnetically-shielded-zone proximate to the chip 102. Because of the magnetic-field-shielding structure 104, the magnetically-shielded zone has a first magnetic field magnitude that is less than a second magnetic field magnitude immediately outside of an outermost surface of the magnetic-field-shielding structure 104. Thus, the magnetic-field-shielding structure 104 reduces the magnetic field experienced by the chip 102, thereby helping to improve data retention within MRAM cells on the chip.

The chip 102 includes a semiconductor substrate 106 and an interconnect structure 108 disposed over the semiconductor substrate 106. Often, the chip includes transistors 110 disposed in the semiconductor substrate 106, and an array of MRAM cells (e.g., MRAM cell 112) arranged in the interconnect structure 108. In some embodiments, the semiconductor substrate 106 has a first face on which active devices, such as transistors 110, are disposed and a second face opposite the first face, wherein an axis 123 passes perpendicularly through the first face and the second face.

The magnetic-field-shielding structure 104 is made of one or more conductive or magnetic materials. In some embodiments, the magnetic-field-shielding structure 104 comprises a sidewall region 114 that laterally surrounds the chip 102, an upper region 116 extending upward from the sidewall region 114, and a lower region 118 extending downward from the sidewall region 114. At least one of the upper region 116 and/or lower region 118 terminate at an opening (e.g., 120 or 122) over the chip 102.

In the example of FIGS. 1A-1B, a first opening 120 is disposed over an upper face of the chip 102, and a second opening 122 is disposed beneath a lower face of the chip 102. In some embodiments, a center of the upper and/or lower opening lies on the axis 123, and the upper opening and/or lower opening is substantially symmetrical about the axis 123.

In some embodiments, the upper region 116 comprises: an upper pillar region 124 that extends upwardly from the sidewall region 114; and an upper overhang region 126 that extends inwardly from an uppermost extent of the upper pillar region 124 to overhang a peripheral region of the first face; wherein the upper overhang region 126 terminates at the first opening 120, such that the upper overhang region 126 does not directly overhang a central region of the first face. See also, FIGS. 2B, 2C, 2D, and 2E.

In some embodiments, the magnetic-field-shielding structure 104 includes a first beveled inner corner 128 where the upper pillar region 124 meets the upper overhang region 126. See also, FIGS. 2B, 2C, 2D, and 2E.

In some embodiments, the lower region 118 comprises: a lower pillar region 130 that extends downwardly from the sidewall region 114; and a lower overhang region 132 that extends inwardly from a lowermost extent of the lower pillar region 130 to overhang a peripheral region of the second face; wherein the lower overhang region 132 terminates at the second opening 122, such that the lower overhang region 132 does not directly overhang a central region of the second face.

In some embodiments, the magnetic-field-shielding structure 104 includes a second beveled inner corner 134 where the lower pillar region 130 meets the lower overhang region 132. In some embodiments, the second beveled inner corner 134 can have the same radius of curvature as the first beveled inner corner 128, which can promote shielding from magnetic fields that are expected to be symmetric with regards to the chip. In other embodiments, the second beveled inner corner 134 can have a radius of curvature which is greater than or less than that of the first beveled inner corner 128, which can promote shielding from magnetic fields that are expected to be asymmetric with regards to the chip.

In some embodiments, the first opening 120 and second opening 122 have equal sizes (see also, FIGS. 2A-2E and FIG. 3A). However, in other embodiments, the first opening 120 and second opening 122 have different sizes (see e.g., FIGS. 3B-3C).

Figure 2A:
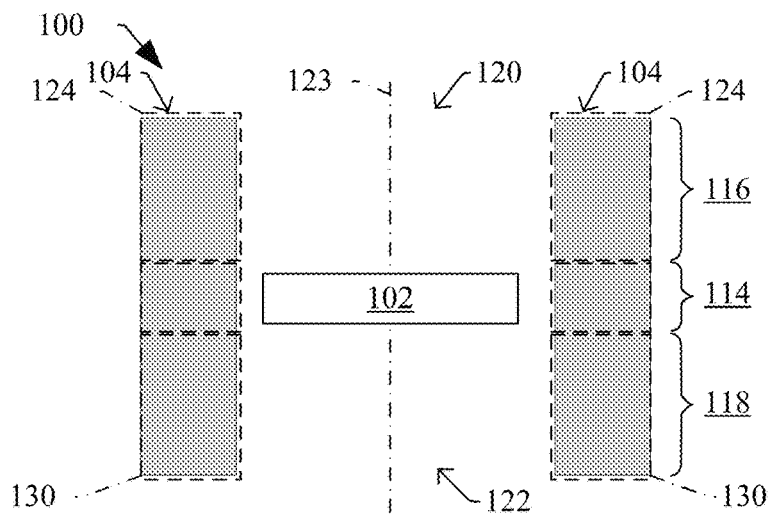
FIGS. 2A-2E each depict a cross-sectional view and a corresponding perspective view of various embodiments of a memory device that makes use of a magnetic-field-shielding structure in accordance with some embodiments.
Figure 2A:
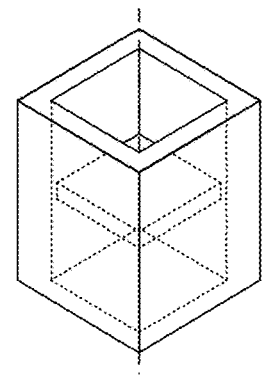
Figure 2B:
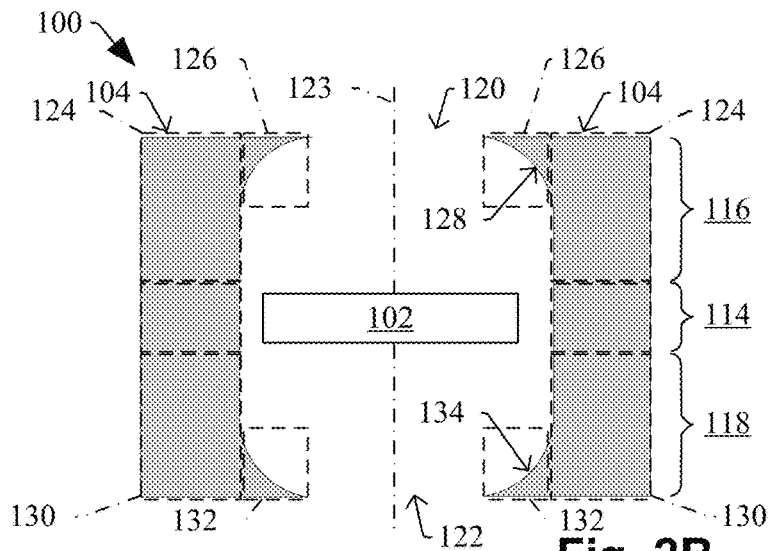
Figure 2B:
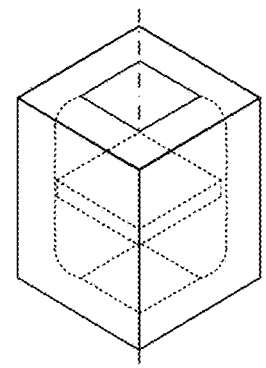
Figure 2C:
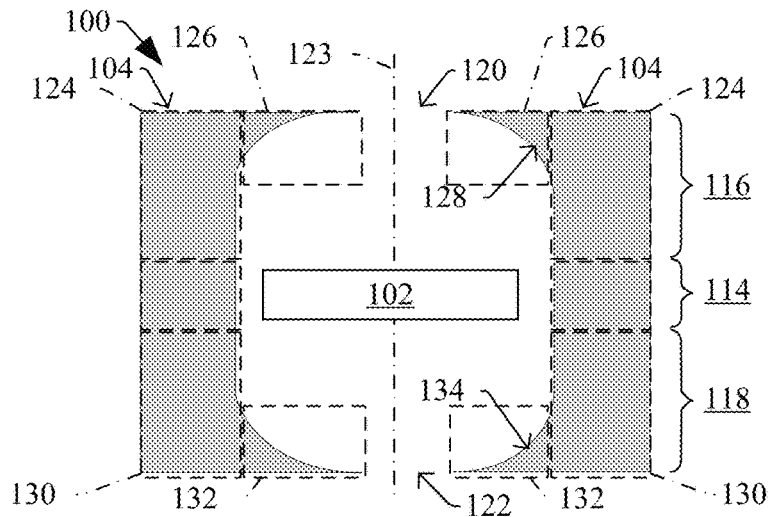
Figure 2C:
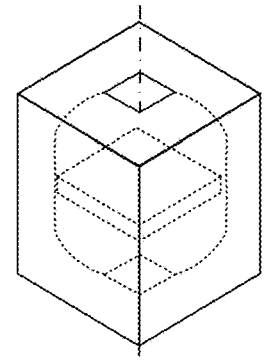
Figure 2D:
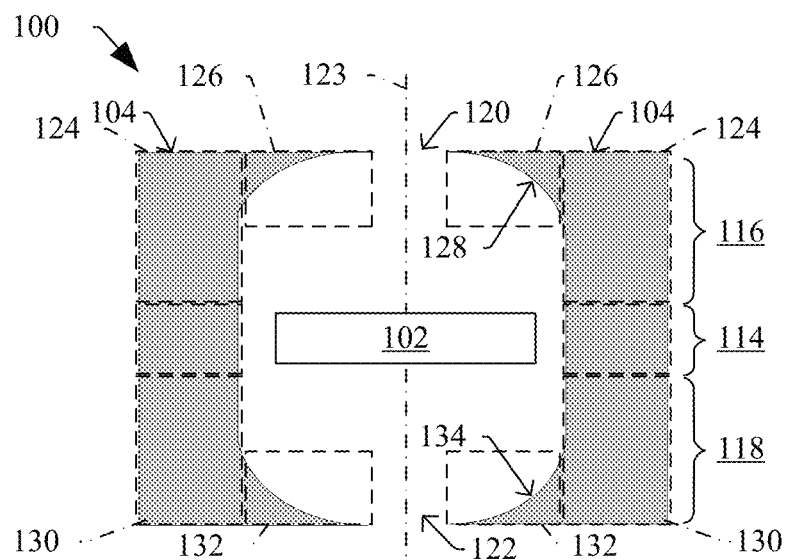
Figure 2E:
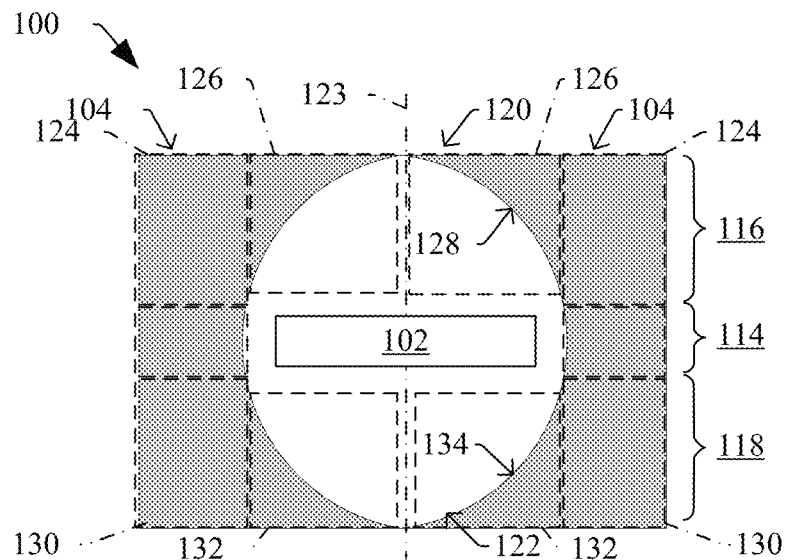
Figure 3A:
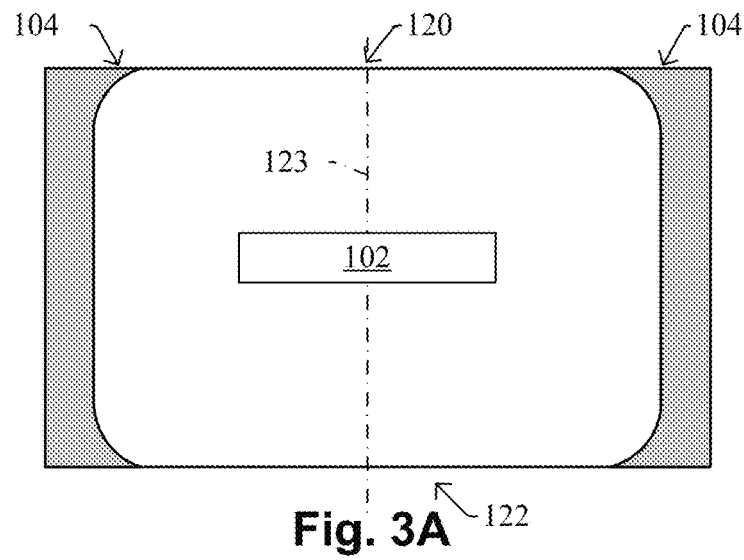
FIGS. 3A-3C depict cross-sectional views of various embodiments of a memory device that makes use of a magnetic-field-shielding structure in accordance with some embodiments.
Figure 3B:
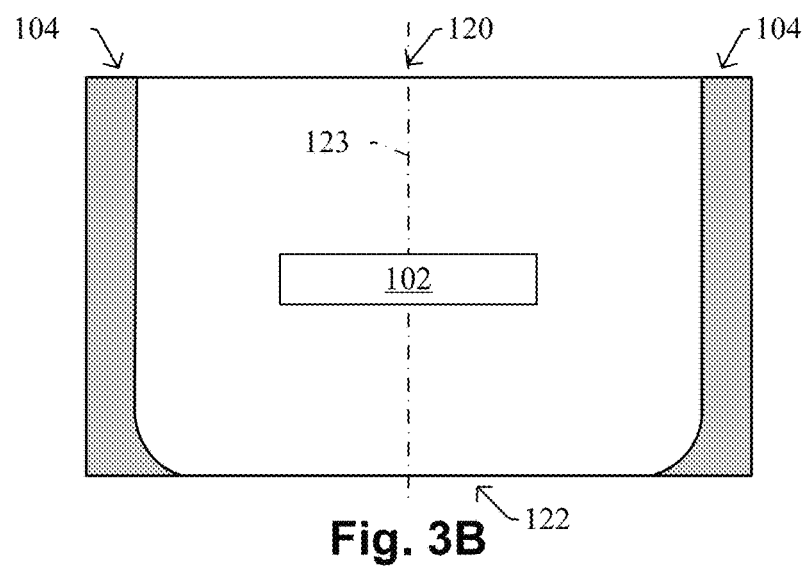
Figure 3C:
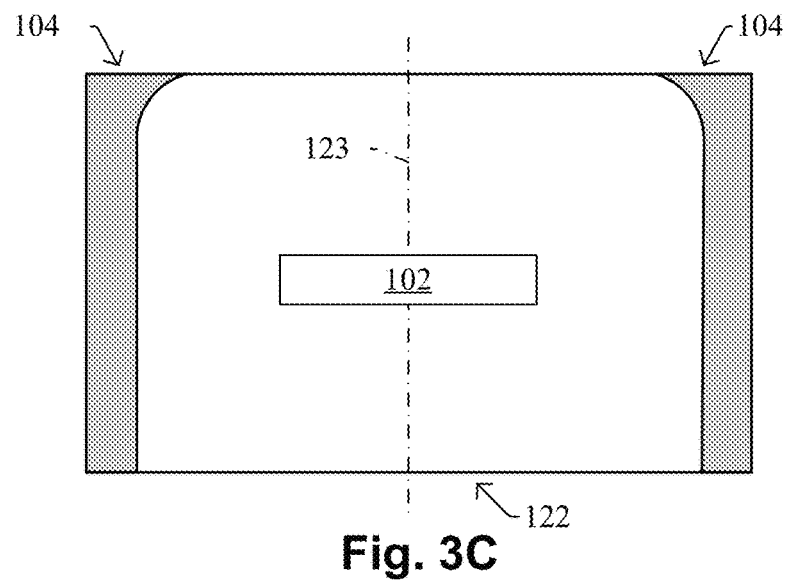

In other embodiments, the upper and/or lower overhang regions 126, 132 are absent, and innermost sidewalls of the upper pillar region 124 and lower pillar region 130 are substantially planar (see e.g., FIG. 2A).

In some embodiments, the magnetic-field-shielding structure comprises multiple layers of conductive or magnetic films separated from one another by insulating films. Several examples are illustrated in FIGS. 4A-4E. For example, conductive or magnetic layers 402 can comprise conductive or magnetic material, such as silicon, steel, iron, carbon, silicon steel, carbon steel, or other materials comprising iron (Fe), cobalt (Co), nickel (Ni), silicon (Si), and/or carbon (C). Insulating layers 404 can comprise insulating materials, and can for example, include low-K material, high-K material, or silicon dioxide.

Figure 4A:
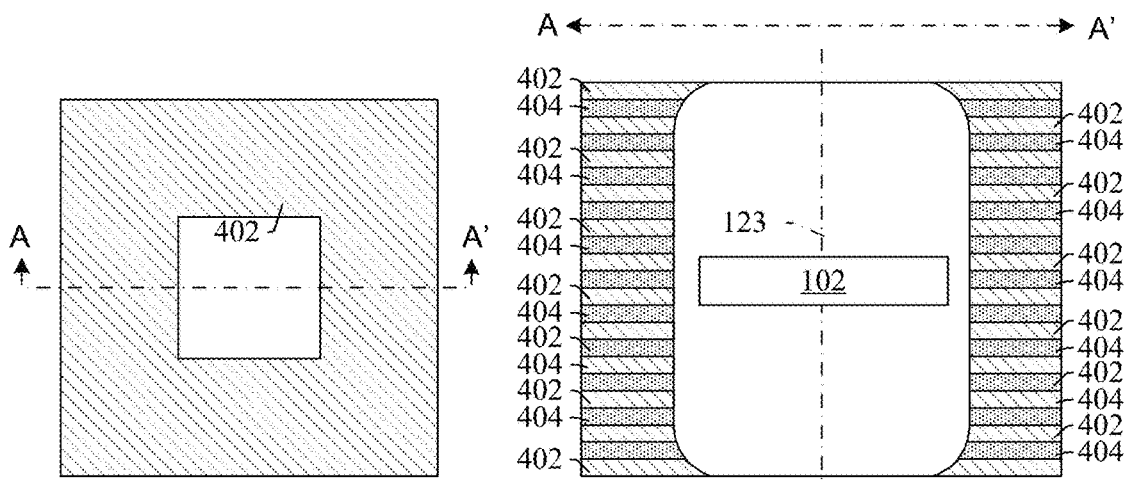
FIGS. 4A-4E each depict a top view and a cross-sectional view of various embodiments of a memory device that makes use of a magnetic-field-shielding structure in accordance with some embodiments.

For example, FIG. 4A illustrates some embodiments of a magnetic-field-shielding structure 104 that comprises multiple layers of conductive or magnetic layers 402 separated from one another by insulating layers 404. The left portion of FIG. 4A illustrates a top view of the magnetic-field-shielding structure 104, while the right portion of FIG. 4A illustrates a cross-sectional view of the magnetic-field-shielding structure 104 as taken along line A-A' of the left portion of FIG. 4A. The conductive or magnetic layers 402 are ring-shaped structures that are stacked one over another so the center of each ring-shaped structure lies along axis 123. The conductive or magnetic layers 402 lie in respective planes that are generally parallel to one another and which parallel to a plane in which chip 102 lies, and the planes of the conductive or magnetic layers are generally perpendicular to axis 123. Insulating layers 404, which are also ring-shaped structures, and are stacked between respective conductive or magnetic layers 402 so as to separate neighboring conductive or magnetic layers 402 from one another. For the insulating layers 404, the center of each ring-shaped structure lies along axis 123. The insulating layers 404 lie in respective planes that are generally parallel to one another and to the conductive or magnetic layers 402. In some embodiments, the conductive or magnetic layers 402 can have equal thicknesses as one another. For example, in some embodiments, the conductive or magnetic layers 402 can have individual thicknesses ranging from 1 μm to 1 mm. Similarly, the insulating layers 404 can have equal thicknesses as one another. For example, in some embodiments, the insulating layers 404 can have individual thicknesses ranging from 1 μm to 1 mm. In some cases the conductive or magnetic layers 402 have individual thicknesses that are equal to individual thicknesses of the insulating layers 404, but in other cases, the conductive or magnetic layers 402 have individual thicknesses that are greater than or less than individual thicknesses of the insulating layers 404.

Figure 4B:
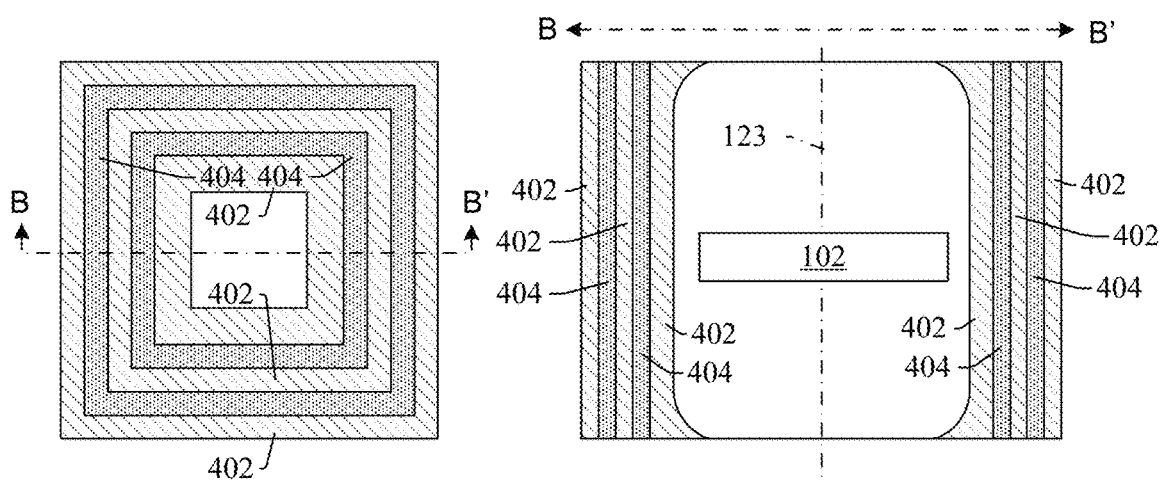

FIG. 4B illustrates other embodiments of a magnetic-field-shielding structure 104 that comprises multiple conductive or magnetic layers 402 separated from one another by insulating layers 404. The left portion of FIG. 4B illustrates a top view of the magnetic-field-shielding structure 104, while the right portion of FIG. 4B illustrates a cross-sectional view of the magnetic-field-shielding structure 104 as taken along line B-B' of the left portion of FIG. 4B. As can be seen from the top view of FIG. 4B (left), the conductive or magnetic layers 402 are ring-shaped structures that are concentric with one another and that have centers that lie on axis 123. As can be seen in FIG. 4B (right), compared to FIG. 4A, the conductive or magnetic layers 402 are now elongated along axis 123. Insulating layers 404, which are also ring-shaped structures, are disposed between respective conductive or magnetic layers 402 so as to separate neighboring conductive or magnetic layers 402 from one another. The insulating layers 404 are also concentric with regards to one another and with regards to the conductive or magnetic layers 402. In some embodiments, the conductive or magnetic layers 402 can have equal thicknesses as one another. For example, in some embodiments, the conductive or magnetic layers 402 can have individual thicknesses ranging from 1 μm to 1 mm. Similarly, the insulating layers 404 can have equal thicknesses as one another. For example, in some embodiments, the insulating layers 404 can have individual thicknesses ranging from 1 μm to 1 mm. In some cases the conductive or magnetic layers 402 have individual thicknesses that are equal to individual thicknesses of the insulating layers 404, but in other cases, the conductive or magnetic layers 402 have individual thicknesses that are greater than or less than individual thicknesses of the insulating layers 404.

Figure 4C:
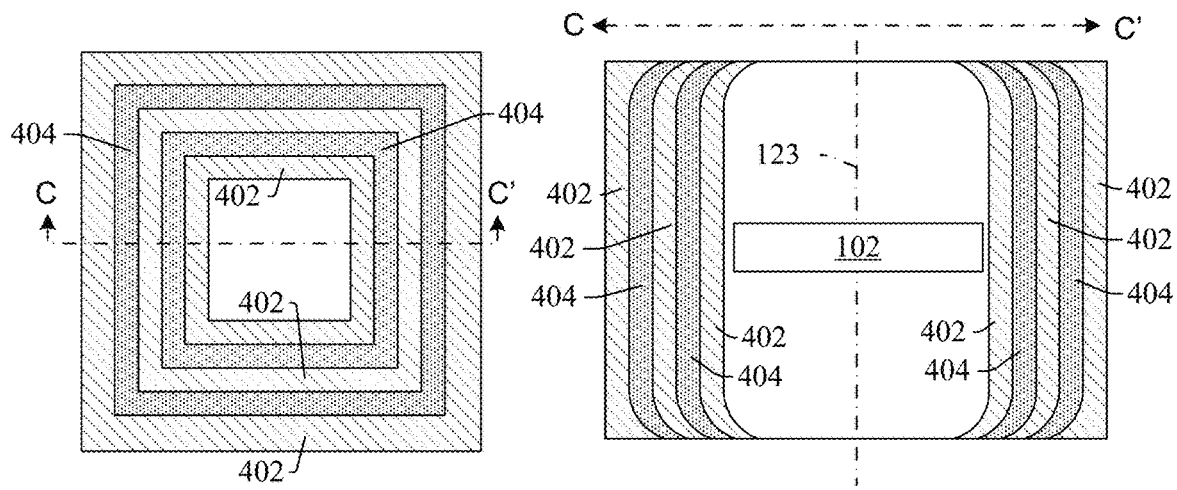

FIG. 4C illustrates other embodiments of a magnetic-field-shielding structure 104 that comprises multiple layers of conductive or magnetic layers 402 separated from one another by insulating layers 404. In FIG. 4C, the conductive or magnetic layers 402 are again ring-shaped structures that are concentric with one another and that have centers that lie on axis 123. As can be seen in FIG. 4C (right), which shows a cross-sectional view as taken along line C-C' of the left portion of FIG. 4C, compared to FIG. 4B, the conductive or magnetic layers 402 and insulating layers 404 now have an upper tapered portion that generally follows the curvature of the beveled inner upper corner, and have a lower tapered portion that generally follows the curvature of the beveled inner lower corner. Insulating layers 404, which are also ring-shaped structures, are disposed between respective conductive or magnetic layers so as to separate neighboring conductive or magnetic layers from one another. The insulating layers 404 are also concentric with regards to one another and with regards to the conductive or magnetic layers.

Figure 4D:
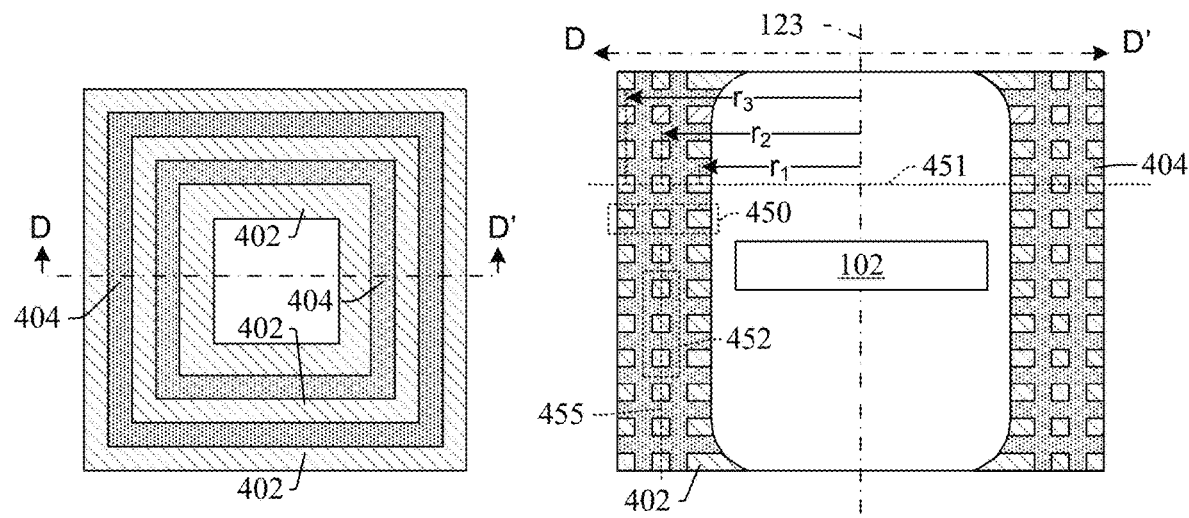

FIG. 4D illustrates other embodiments of a magnetic-field-shielding structure 104 that comprises multiple layers of conductive or magnetic films separated from one another by insulating films. The left portion of FIG. 4D illustrates a top view of the magnetic-field-shielding structure 104, while the right portion of FIG. 4B illustrates a cross-sectional view of the magnetic-field-shielding structure 104 as taken along line D-D' of the left portion of FIG. 4D. In FIG. 4D, the conductive or magnetic layers 402 are again ring-shaped structures that are concentric with one another and that have centers that lie on axis 123. However, whereas each conductive or magnetic ring-shaped structure at a given radius in FIG. 4C was continuous and elongated from an uppermost surface of the magnetic-field-shielding structure to a lowermost surface of the magnetic-field-shielding structure, multiple conductive or magnetic ring-shaped structures for a given radius are spaced apart at different heights between an uppermost surface of the magnetic-field-shielding structure and a lowermost surface of the magnetic-field-shielding structure in FIG. 4D. Thus, in FIG. 4D, a first set of ring-shaped structures 450 have different radii (e.g., $r_1$, $r_2$, $r_3$) relative to one another along a first plane 451, which is perpendicular to axis 123, and a second set of ring-shaped structures 452 have equal radii (e.g., $r_2$) relative to one another along a second plane 455 parallel to the axis 123. An insulating structure 404 is disposed between respective conductive or magnetic layers 402 so as to separate neighboring conductive or magnetic ring-shaped structures from one another.

Figure 4E:
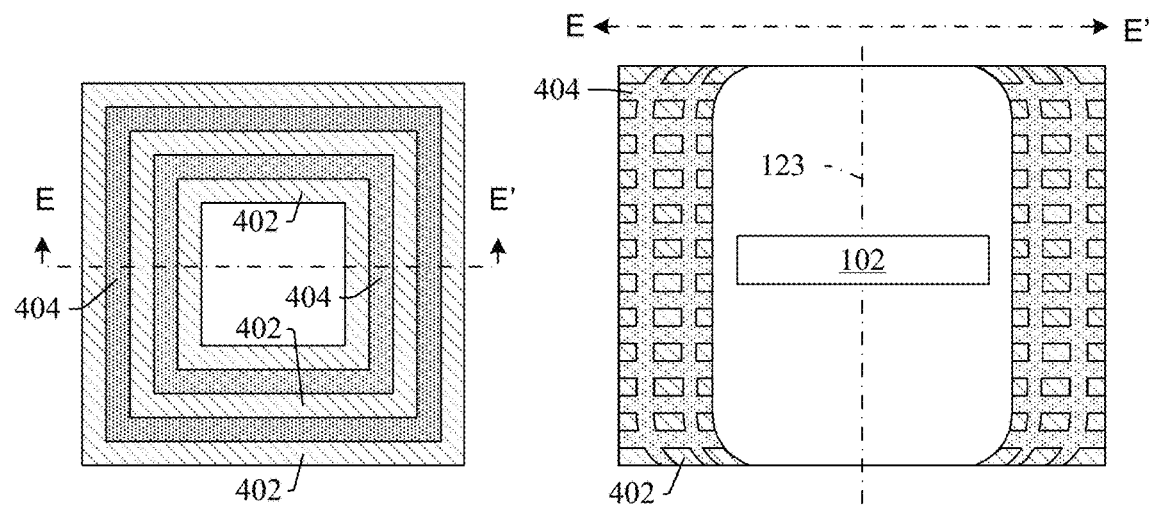

The left portion of FIG. 4E illustrates a top view of the magnetic-field-shielding structure 104, while the right portion of FIG. 4E illustrates a cross-sectional view of the magnetic-field-shielding structure 104 as taken along line E-E' of the left portion of FIG. 4E. As can be seen in FIG. 4E (right), compared to FIG. 4D, the conductive or magnetic layers 402 and insulating layers can alternatively have an upper tapered portion that generally follows the curvature of the beveled inner upper corner, and have a lower tapered portion that generally follows the curvature of the beveled inner lower corner. Insulating structure 404 is again disposed between respective conductive or magnetic layers so as to separate neighboring conductive or magnetic layers from one another.

As can be seen in FIG. 4E (right), compared to FIG. 4D, the conductive or magnetic layers 402 and insulating layers can alternatively have an upper tapered portion that generally follows the curvature of the beveled inner upper corner, and have a lower tapered portion that generally follows the curvature of the beveled inner lower corner. Insulating structure 404 is again disposed between respective conductive or magnetic layers so as to separate neighboring conductive or magnetic layers from one another.

FIGS. 5A-5D illustrate further examples where insulating package material 502 encapsulates the chip 102 to form a package structure. In some embodiments, the insulating package material 502 comprises plastic (thermoset or thermoplastic) or ceramic, and is often black in color. In some embodiments, such as illustrated in FIGS. 5A-5D, for example, an outermost surface of the insulating package material 502 is spaced apart from an innermost surface of the magnetic-field-shielding structure 104, such that the magnetic-field-shielding structure 104 resides outside of the package structure. The package structure, including the chip 102 and its insulating package material 502, as well as the magnetic-field-shielding structure 104 are mounted to a printed circuit board (PCB) substrate 506.

Figure 5A:
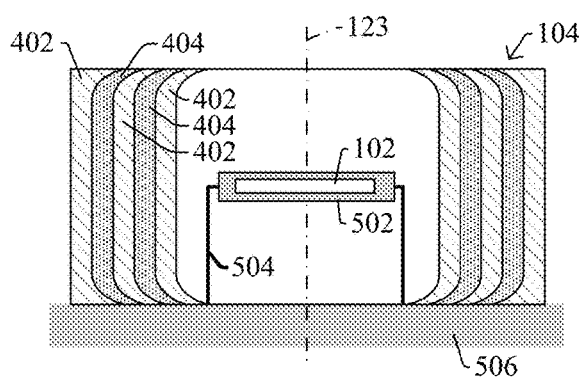
FIGS. 5A-5D each depict a cross-sectional view of various embodiments of a packaged memory device where a magnetic-field-shielding structure is external to the package when mounted on a printed circuit board (PCB) in accordance with some embodiments.

In FIG. 5A, for instance, insulating package material 502 encapsulates the chip 102 to form a package structure, and magnetic-field-shielding structure 104 surrounds the insulating package material 502 and the chip 102. Conductive leads 504, such as a lead frame made of aluminum or copper, couples bond pads or other structures on the chip 102 to conductive traces on the PCB substrate 506. In FIG. 5A, the conductive leads 504 remain entirely within the magnetic-field-shielding structure 104. The magnetic-field-shielding structure 104 can be secured to the PCB substrate 506 through epoxy, glue, solder, or other fasteners.

Figure 5B:
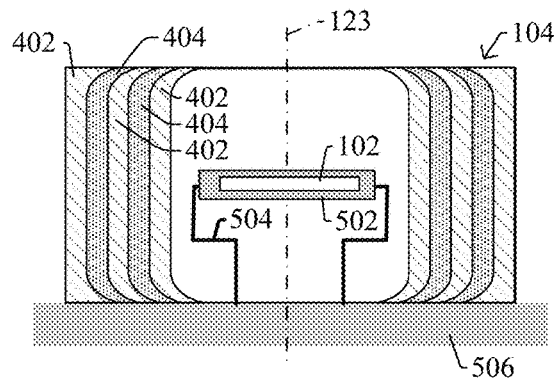

FIG. 5B shows another embodiment where insulating package material 502 encapsulates the chip 102 to form a package structure, and magnetic-field-shielding structure 104 surrounds the insulating package material 502 and the chip 102. In contrast to FIG. 5A where conductive leads 504 extend solely vertically between the chip 102 and PCB substrate 506, in FIG. 5B the conductive leads 504 are bent inwards to extend under the chip so the conductive leads 504 meet the PCB directly under the chip 102, which allows the magnetic-field-shielding structure 104 to have a smaller opening proximate the PCB substrate 506.

Figure 5C:
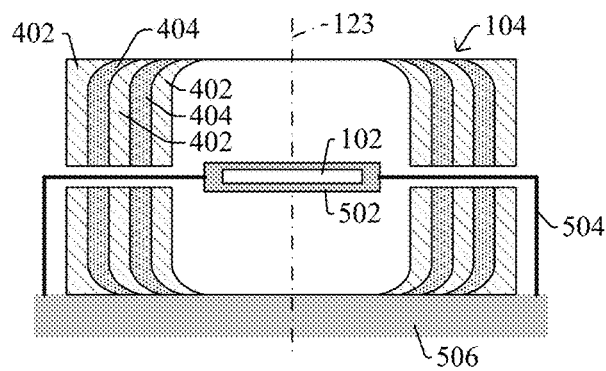

FIG. 5C shows another embodiment where the magnetic-field-shielding structure 104 includes openings in its sidewalls to accommodate the conductive leads 504. Thus, the openings may be round, square, rectangular, or other shapes when viewed from the face of the sidewalls, and the conductive leads 504 pass through the openings to extend through the magnetic-field-shielding structure 104, and thus ultimately extend outward beyond the outer edge of the magnetic-field-shielding structure 104 to couple to the PCB substrate 506.

Figure 5D:
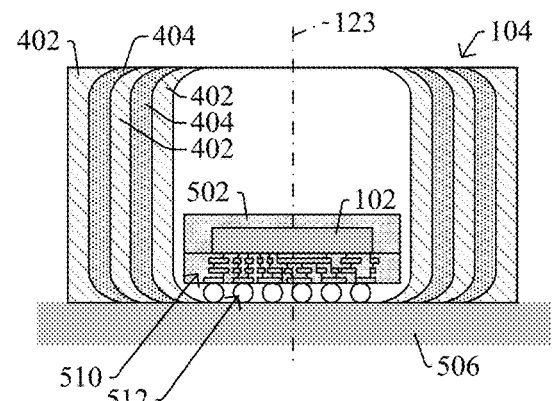

FIG. 5D shows another embodiment where bond pads, solder bumps, or other conductive structures on the chip 102 can be operably coupled to conductive traces on the PCB substrate 506 through a redistribution layer 510 and solder bumps 512. The redistribution layer 510 can include one or more conductive layers disposed in a dielectric structure, wherein the redistribution layer 510 can enable "fan out" such that the solder bumps 512 can have a footprint that is larger than that of the bond pads on the chip 102. The magnetic-field-shielding structure 104 can be secured to the PCB substrate 506 through epoxy, glue, solder, or other fasteners.

In some embodiments, such as shown in FIGS. 6A-6D, the insulating package material 502 encapsulates the chip 102 and the magnetic-field-shielding structure 104. Thus, the magnetic-field-shielding structure 104 and chip 102 are surrounded by and optionally entirely encapsulated by the insulating package material 502 to establish a package structure.

Figure 6A:
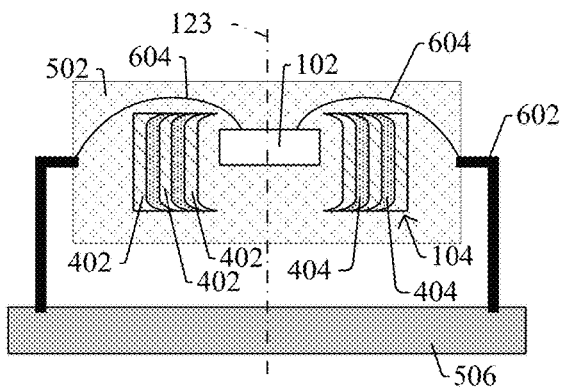
FIGS. 6A-6D each depict a cross-sectional view of various embodiments of a packaged memory device where a magnetic-field-shielding structure is disposed within the package and then mounted on a printed circuit board (PCB) in accordance with some embodiments.

In FIG. 6A, a wire bond 604 extends through the insulating package material 502 to a lead frame 602 to electrically couple a bond pad or solder bump on the chip 102 to a conductive trace on the printed circuit board (PCB). In passing through the insulating package material 502, the wire bond 604 passes though the opening in an upper surface of the magnetic-field-shielding structure 104 and over an upper surface of the magnetic-field-shielding structure to couple to the lead frame 602.

Figure 6B:
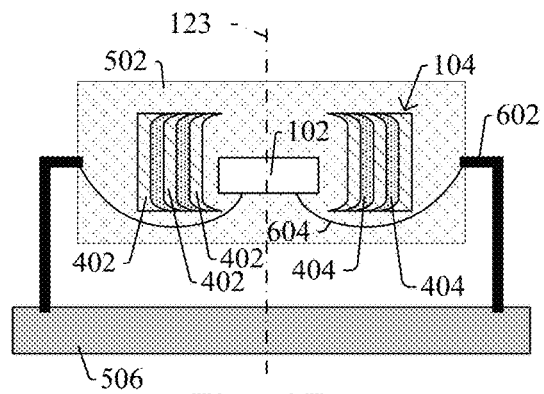

FIG. 6B shows an alternate embodiment where the wire bond 604 passes though the opening in a lower surface of the magnetic-field-shielding structure 104 and below a lower surface of the magnetic-field-shielding structure to couple to the lead frame 602.

Figure 6C:
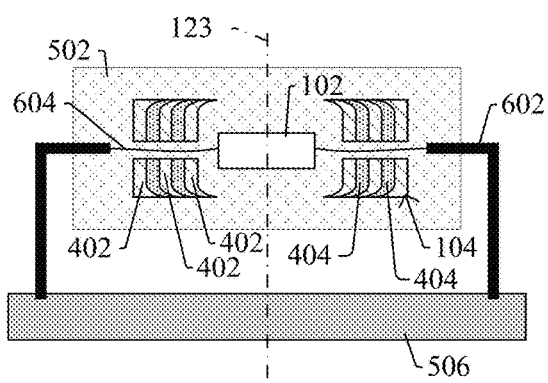

FIG. 6C shows another embodiment where the magnetic-field-shielding structure 104 includes openings in its sidewalls. Thus, the wire bond 604 passes though the opening in the sidewall of the magnetic-field-shielding structure 104 to couple to the lead frame 602.

Figure 6D:
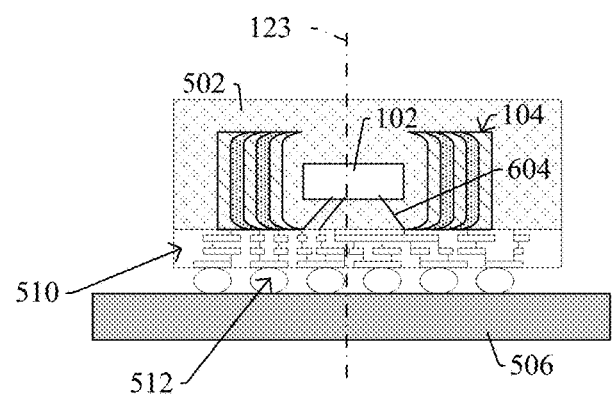

FIG. 6D shows another embodiment where insulating package material 502 encapsulates chip 102 and magnetic-field-shielding structure 104. In FIG. 6D, however, bond pads, solder bumps, or other conductive structures on the chip 102 can be operably coupled to conductive traces on the PCB substrate 506 through optional wire bonds 604 and a redistribution layer 510 and solder bumps 512. The redistribution layer 510 can include one or more conductive layers disposed in a dielectric structure, wherein the redistribution layer 510 can enable "fan out" such that the solder bumps 512 can have a footprint that is larger than that of the bond pads on the chip 102. In other embodiments, the bond pads or other conductive features (e.g., copper pillars) on the chip 102 can be directly bonded to the redistribution layer 510 without the illustrated wire bonds 604.

Figure 7:
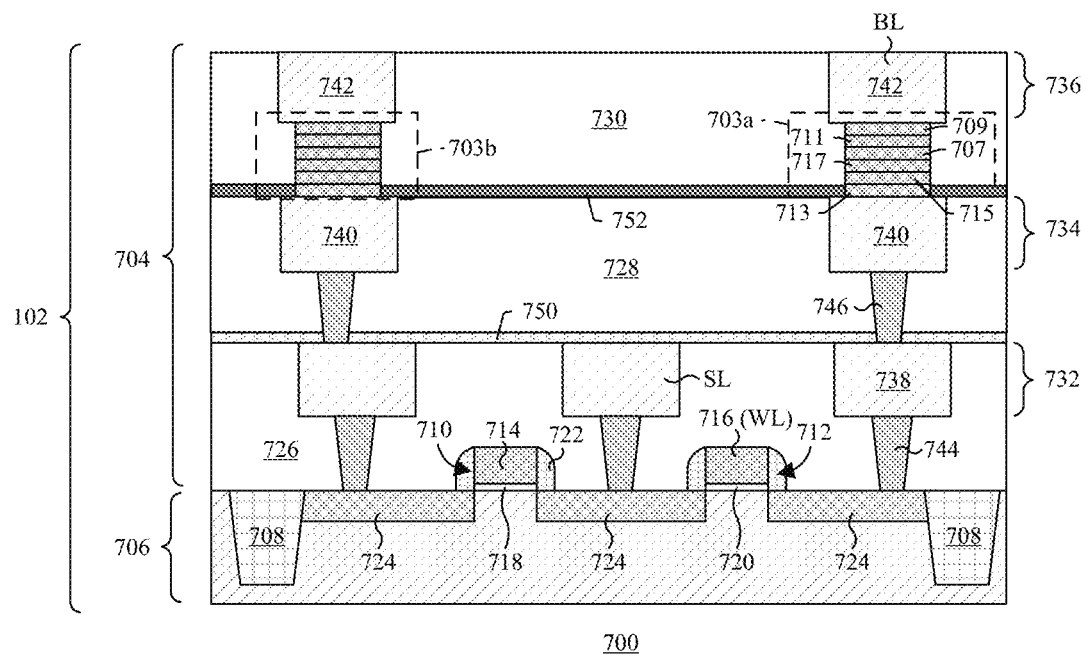
FIG. 7 illustrates a cross-sectional diagram illustrating some embodiments of a memory device that includes a semiconductor substrate with an interconnect structure there over, wherein the memory device includes a MTJ or MRAM cell disposed in the interconnect structure.

FIG. 7 illustrates a cross sectional view of some embodiments of an integrated circuit 700, which may also be referred to as a chip (e.g., chip 102) in some embodiments. The integrated circuit 700 includes MTJ memory elements 703a, 703b disposed in an interconnect structure 704 of the integrated circuit 700. The MTJ memory elements 703a, 703b can be part of an array of MTJ elements, which are included in an MRAM device.

The integrated circuit 700 includes a substrate 706. The substrate 706 may be, for example, a bulk substrate (e.g., a bulk monocrystalline silicon substrate) or a silicon-on-insulator (SOI) substrate. The illustrated embodiment depicts one or more shallow trench isolation (STI) regions 708, which may include a dielectric-filled trench within the substrate 706.

Access transistors 710, 712 are disposed between the STI regions 708. The access transistors 710, 712 include gate electrodes 714, 716, respectively; gate dielectrics 718, 720, respectively; sidewall spacers 722; and source/drain regions 724. The source/drain regions 724 are disposed within the substrate 706 between the gate electrodes 714, 716 and the STI regions 708, and are doped to have a first conductivity type which is opposite a second conductivity type of a channel region under the gate dielectrics 718, 720, respectively. The gate electrodes 714, 716 may be, for example, doped polysilicon or a metal, such as aluminum, copper, or combinations thereof. The gate dielectrics 718, 720 may be, for example, an oxide, such as silicon dioxide, or a high-κ dielectric material. The sidewall spacers 722 can be made of silicon nitride (e.g., $Si_3N_4$), for example.

The interconnect structure 704 is arranged over the substrate 706 and couples devices (e.g., access transistors 710, 712) to one another. The interconnect structure 704 includes a plurality of IMD layers 726, 728, 730, and a plurality of metallization layers 732, 734, 736 which are layered over one another in alternating fashion. The IMD layers 726, 728, 730 may be made, for example, of a low κ dielectric, such as un-doped silicate glass, or an oxide, such as silicon dioxide, or an extreme low κ dielectric layer. The metallization layers 732, 734, 736 include metal lines 738, 740, 742, which are formed within trenches, and which may be made of a metal, such as copper or aluminum. Contacts 744 extend from the bottom metallization layer 732 to the source/drain regions 724 and/or gate electrodes 714, 716; and vias 746 extend between the metallization layers 732, 734, 736. The contacts 744 and the vias 746 extend through dielectric-protection layers 750, 752 (which can be made of dielectric material and can act as etch stop layers during manufacturing). The dielectric-protection layers 750, 752 may be made of an extreme low-κ dielectric material, such as SiC, for example. The contacts 744 and the vias 746 may be made of a metal, such as copper or tungsten, for example.

MTJ memory elements 703a, 703b, which are configured to store respective data states, are arranged within the interconnect structure 704 between neighboring metal layers. The MTJ memory element 703a includes an MTJ, including an anti-ferromagnetic layer 713, pinned layer 715, metallic interlayer 717, ferromagnetic reference layer 707, non-magnetic barrier layer 711, and ferromagnetic free layer 709.

In some embodiments, the anti-ferromagnetic layer 713 comprises platinum manganese (PtMn), the pinned layer 715 comprises CoFeB, and the metallic interlayer 717 comprises ruthenium (Ru). The metallic interlayer 717 has a predetermined thickness, which introduces a strong anti-parallel coupling between the pinned layer 715 and the ferromagnetic reference layer 707. For example, in some embodiments where the metallic interlayer 717 is a transition metal, a transition metal alloy, or even an oxide to provide strong anti-ferromagnetic interlayer-exchange coupling (IEC), the metallic interlayer 717 has a thickness ranging from 1.2 angstroms to approximately 30 angstroms. In some embodiments, the metallic interlayer 717 is a ruthenium (Ru) layer or iridium layer.

In some embodiments, the non-magnetic barrier layer 711 can comprise an amorphous barrier, such as aluminum oxide ($AlO_x$) or titanium oxide ($TiO_x$); or a crystalline barrier, such as manganese oxide (MnO), magnesium oxide (MgO), or spinel ($MgAl_2O_4$, which is also known as MAO in some contexts). In embodiments, the non-magnetic barrier layer 711 is a tunnel barrier which is thin enough to allow quantum mechanical tunneling of current between the ferromagnetic free layer 709 and ferromagnetic reference layer 707. In alternative embodiments where the MTJ is replaced with a spin valve, the non-magnetic barrier layer 711 is typically a non-magnetic metal. Examples of non-magnetic metals include, but are not limited to: copper, gold, silver, aluminum, lead, tin, titanium and zinc; and/or alloys such as brass and bronze.

The ferromagnetic free layer 709 is capable of changing its magnetization direction between one of two magnetization states, which have different resistances and which correspond to binary data states stored in the memory cell. In some embodiments, the ferromagnetic free layer 709 can comprise a magnetic metal, such as iron, nickel, cobalt and alloys thereof, for example. For instance, in some embodiments, the ferromagnetic free layer 709 can comprise cobalt, iron, and boron, such as a CoFeB ferromagnetic free layer; and the non-magnetic barrier layer 711 can comprise an amorphous barrier, such as aluminum oxide ($AlO_x$) or titanium oxide ($TiO_x$), or a crystalline barrier, such as manganese oxide (MnO), magnesium oxide (MgO), or spinel ($MgAl_2O_4$).

In some cases when the anti-ferromagnetic layer 713 is present for in-plane MTJS, the anti-ferromagnetic layer 713 can provide exchange bias to the pinned layer 715. However, it is noted that the anti-ferromagnetic layer 713 is optional, and in fact, is not present in many MTJs.

A bit-line (BL) is coupled to one end of the MTJ memory element 703a, and a source-line (SL) is coupled to an opposite end of the MTJ memory element through the access transistor 712. Thus, application of a suitable word-line (WL) voltage to a gate electrode of the access transistor 712 couples the MTJ memory element 703a between the BL and the SL, and allows a bias to be applied over the MTJ memory element 703a through the BL and the SL. Consequently, by providing suitable bias conditions, the MTJ memory element 703a can be switched between two states of electrical resistance, a first state with a low resistance (magnetization directions of reference layer and free layer are parallel) and a second state with a high resistance (magnetization directions of reference layer and free layer are antiparallel), to store data.

Although this disclosure is described largely in terms of MTJs, it is also to be appreciated that it is applicable to spin valve memory elements, which may use a magnetically soft layer as the ferromagnetic free layer 709, and a magnetically hard layer as the ferromagnetic reference layer 707, and a non-magnetic barrier separating the magnetically hard layer and magnetically soft layer.

Some embodiments relate to a memory device. The memory device includes a chip including a magnetic random access memory (MRAM) cell thereon. A magnetic-field-shielding structure comprises conductive or magnetic material at least partially surrounds the chip. The magnetic-field-shielding structure comprises a sidewall region that laterally surrounds the chip, an upper region extending upward from the sidewall region, and a lower region extending downward from the sidewall region. At least one of the upper region and/or the lower region terminates at an opening over the chip.

Some embodiments relate to a memory device. The memory device includes a chip including a magnetic random access memory (MRAM) cell thereon. The chip includes an upper face and a lower face with chip sidewalls extending between the upper face and the lower face. A magnetic-field-shielding structure at least partially surrounds the chip and defines a magnetically-shielded zone surrounding the chip. The magnetic-field-shielding structure comprises a plurality of layers of conductive or magnetic material and a plurality of layers of insulating material. The plurality of layers of insulating material are arranged between the respective plurality of layers of conductive or magnetic material.

Some embodiments relate to a memory device including a chip having a magnetic random access memory (MRAM) cell thereon. The chip includes an upper face and a lower face with chip sidewalls extending between the upper face and the lower face. A magnetic-field-shielding structure at least partially surrounds the chip. The magnetic-field-shielding structure comprises a sidewall region that laterally surrounds the chip sidewalls and a first overhang region that extends inwardly from the sidewall region to overhang a peripheral region of a first of the upper face or the lower face without completely covering the entire upper face or without completely covering the entire lower face. The magnetic-field-shielding structure includes a first beveled inner corner where the sidewall region meets the first overhang region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
a chip including a magnetic random access memory (MRAM) cell thereon;

a magnetic-field-shielding structure comprised of conductive or magnetic material at least partially surrounding the chip, wherein the magnetic-field-shielding structure comprises a sidewall region that laterally surrounds the chip, an upper region extending upward from the sidewall region, and a lower region extending downward from the sidewall region; and wherein the magnetic-field-shielding structure further comprises an upper overhang region extending inwardly from the upper region and over an upper surface of the chip to terminate at a first opening over the chip, and a lower overhang region extending inwardly from the lower region and under a lower surface of the chip to terminate at a second opening under the chip.

2. The memory device of claim 1, wherein the magnetic-field-shielding structure comprises a plurality of layers of conductive or magnetic material that are separated from one another by a plurality of layers of insulating material, respectively.

3. The memory device of claim 1, further comprising:
insulating package material encapsulating the chip and the magnetic-field-shielding structure, the insulating package material being arranged between an outermost surface of the chip and an innermost surface of the magnetic-field-shielding structure, and the insulating package material surrounding an outermost surface of the magnetic-field-shielding structure to establish a package structure; and
electrical connectors extending through the insulating package material to electrically couple the chip to a solder bump or lead frame configured to be mounted to a printed circuit board (PCB).

4. The memory device of claim 1, wherein the chip includes a semiconductor substrate having a first face on which active devices are disposed and a second face opposite the first face, wherein an axis passes perpendicularly through the first face, the second face, and at least one of the first opening or the second opening.

5. The memory device of claim 4, wherein a center of the at least one of the first opening or the second opening lies on the axis, and the at least one of the first opening or the second opening is substantially symmetric about the axis.

6. The memory device of claim 4, wherein the
upper overhang region extends inwardly from an uppermost extent of the upper region to overhang a peripheral region of the first face; and
wherein the upper overhang region terminates at the first opening, such that the upper overhang region does not directly overhang a central region of the first face.

7. The memory device of claim 6, wherein the magnetic-field-shielding structure includes a first beveled inner corner where the upper region meets the upper overhang region.

8. The memory device of claim 6, wherein the
lower overhang region extends inwardly from a lowermost extent of the lower region to overhang a peripheral region of the second face; and
wherein the lower overhang region terminates at the second opening, such that the lower overhang region does not directly overhang a central region of the second face.

9. The memory device of claim 8, wherein the magnetic-field-shielding structure includes a second beveled inner corner where the lower region meets the lower overhang region.

10. The memory device of claim 8, wherein the first opening and the second opening have equal sizes.

11. The memory device of claim 8, wherein the first opening and the second opening have different sizes.

12. A memory device, comprising:
a chip including a magnetic random access memory (MRAM) cell thereon, the chip including an upper face and a lower face with chip sidewalls extending between the upper face and the lower face; and
a magnetic-field-shielding structure at least partially surrounding the chip and defining a magnetically-shielded zone surrounding the chip, wherein the magnetic-field-shielding structure comprises a plurality of layers of conductive or magnetic material and a plurality of layers of insulating material, wherein the plurality of layers of insulating material are arranged between the respective plurality of layers of conductive or magnetic material.

13. The memory device of claim 12, wherein the magnetic-field-shielding structure comprises:
a plurality of ring-shaped structures that are concentric with one another and that have central points that lie on an axis, the plurality of ring-shaped structures being elongated parallel to the axis and comprising conductive or magnetic material; and
a plurality of ring-shaped insulating structures disposed between the plurality of ring-shaped structures to separate neighboring conductive or magnetic layers from one another.

14. The memory device of claim 13, wherein at least one of an upper region of the plurality of ring-shaped structures and/or a lower region of the plurality of ring-shaped structures is tapered.

15. A memory device, comprising:
a chip including a magnetic random access memory (MRAM) cell thereon, the chip including an upper face and a lower face with chip sidewalls extending between the upper face and the lower face;
a magnetic-field-shielding structure at least partially surrounding the chip, wherein the magnetic-field-shielding structure comprises a sidewall region that laterally surrounds the chip sidewalls, and a upper overhang region that extends inwardly from the sidewall region to overhang a peripheral region of the upper face without completely covering the entire upper face, and a lower overhang region that extends inwardly from the sidewall region to overhang a peripheral region of the lower face without completely covering the entire lower face; and
wherein the magnetic-field-shielding structure includes a first beveled inner corner where the sidewall region meets one of the upper or lower overhang region.

16. The memory device of claim 15,
wherein the magnetic-field-shielding structure further includes a second beveled inner corner where the sidewall region meets the other of the upper or lower overhang region.

17. The memory device of claim 15, wherein the magnetic-field-shielding structure comprises:
a plurality of ring-shaped structures that are concentric with one another and that have central points that lie on an axis, the plurality of ring-shaped structures being elongated parallel to the axis and comprising conductive or magnetic material; and
a plurality of ring-shaped insulating structures disposed between the plurality of ring-shaped structures to separate neighboring conductive or magnetic layers from one another.

18. The memory device of claim 3, wherein the electrical connectors extend through magnetic-field-shielding structure to electrically couple the chip to the solder bump or lead frame.

19. The memory device of claim 12, further comprising:
   electrical connectors extending through the magnetic-field-shielding structure to electrically couple the chip to a solder bump or lead frame configured to be mounted to a printed circuit board (PCB).

20. The memory device of claim 15, further comprising:
   electrical connectors extending through the magnetic-field-shielding structure to electrically couple the chip to a solder bump or lead frame configured to be mounted to a printed circuit board (PCB).

\* \* \* \* \*